US012787261B2

(12) United States Patent
Hwang et al.

(10) Patent No.: US 12,787,261 B2
(45) Date of Patent: Nov. 3, 2026

(54) SEMICONDUCTOR DEVICE AND METHOD FOR FABRICATING THE SAME

(71) Applicant: SK hynix Inc., Gyeonggi-do (KR)

(72) Inventors: Chang Youn Hwang, Gyeonggi-do (KR); Sang Soo Park, Gyeonggi-do (KR); Dong Goo Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 356 days.

(21) Appl. No.: 18/393,675

(22) Filed: Dec. 22, 2023

(65) Prior Publication Data

US 2025/0024660 A1 Jan. 16, 2025

(30) Foreign Application Priority Data

Jul. 12, 2023 (KR) ........................ 10-2023-0090664

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02)

(58) Field of Classification Search
CPC ... H10B 12/482; H10B 12/485; H10W 20/46; H10W 20/072; H10W 20/069
See application file for complete search history.

(56) References Cited

U.S. PATENT DOCUMENTS

| | | | | |
|---|---|---|---|---|
| 11,239,111 | B1 * | 2/2022 | Huang | H10B 12/0335 |
| 11,991,876 | B2 * | 5/2024 | Pan | H10B 12/482 |
| 2019/0088739 | A1 * | 3/2019 | Lee | H10B 12/315 |
| 2020/0402981 | A1 | 12/2020 | Kim et al. | |
| 2021/0375878 | A1 * | 12/2021 | Zhang | H10W 20/072 |
| 2022/0020632 | A1 | 1/2022 | You et al. | |

* cited by examiner

*Primary Examiner* — Jacob Y Choi
*Assistant Examiner* — Aaron Michael Wegner
(74) *Attorney, Agent, or Firm* — IP&T GROUP LLP

(57) ABSTRACT

A semiconductor device includes: a plurality of first contacts spaced apart from each other by a predetermined distance in a semiconductor substrate; a plurality of conductive structures formed over the first contacts, extending in a first direction and spaced apart in a second direction perpendicular to the first direction, each of which partially overlaps with each of the first contacts, and having a top surface of a portion that overlaps with each of the first contacts at a lower level than a top surface of a portion that does not overlap with each of the first contacts; a plurality of second contacts disposed between neighboring conductive structures; and a plurality of spacer structures disposed between the conductive structures and the second contacts.

19 Claims, 10 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2023-0090664, filed on Jul. 12, 2023, which is incorporated herein by reference in its entirety.

BACKGROUND

1. Field

Various embodiments of the present invention relate generally to a semiconductor device and a method for fabricating the same, and more particularly, to a semiconductor device including a conductive structure, and a method for fabricating the semiconductor device.

2. Description of the Related Art

Recently, as semiconductor devices are becoming more highly integrated, process margins decrease continuously leading to processing difficulties. In particular, one such processing difficulty relates to forming a contact because a contact opening and a bridge margin which have a trade-off relationship.

SUMMARY

Embodiments of the present invention are directed to a semiconductor device that may prevent a contact-not-open defect and forming a bridge between neighboring conductive structures, and a method for fabricating the semiconductor device.

In accordance with an embodiment of the present invention, a method for fabricating a semiconductor device includes: providing a semiconductor substrate; forming a plurality of first contacts spaced apart from each other by a predetermined distance over the semiconductor substrate; forming a plurality of conductive structures over the first contacts, extending in a first direction and spaced apart from each other in a second direction perpendicular to the first direction and respectively overlapping with the first contacts; forming first spacers covering both sidewalls of each of the conductive structures; forming a plurality of plug material layers disposed between neighboring conductive structures and extending in the first direction; forming a mask pattern locally covering top portions of the conductive structures and the plug material layers; etching the plug material layers that is exposed by the mask pattern to form a plurality of second contacts that are spaced apart from each other in the first direction and to provide spacer holes between the first spacer and the second contacts; and forming second spacers gap-filling the spacer holes.

In accordance with another embodiment of the present invention, a semiconductor device includes: a plurality of first contacts spaced apart from each other by a predetermined distance in a semiconductor substrate; a plurality of conductive structures formed over the first contacts, extending in a first direction and spaced apart in a second direction perpendicular to the first direction, each of which partially overlaps with each of the first contacts, and having a top surface of a portion that overlaps with each of the first contacts at a lower level than a top surface of a portion that does not overlap with each of the first contacts; a plurality of second contacts disposed between neighboring conductive structures; and a plurality of spacer structures disposed between the conductive structures and the second contacts.

In accordance with another embodiment of the present invention, a semiconductor device includes: a plurality of first contacts spaced apart from each other by a predetermined distance in a semiconductor substrate; a plurality of first conductive structures formed over the first contacts; a plurality of second conductive structures arranged alternately with the first conductive structure and formed over a hard mask; a plurality of second contacts disposed between the first conductive structures and the second conductive structures; a plurality of first spacer structures disposed between the first conductive structures and the second contacts; and a plurality of second spacer structures disposed between the second contacts and the second conductive structures, wherein a top surface of the first conductive structures is at a lower level than a top surface of the second conductive structures.

These and other features and advantages of the present invention will become better understood to the skilled person from the detailed description in conjunction with the following drawings.

DETAILED DESCRIPTION

Figure 1:
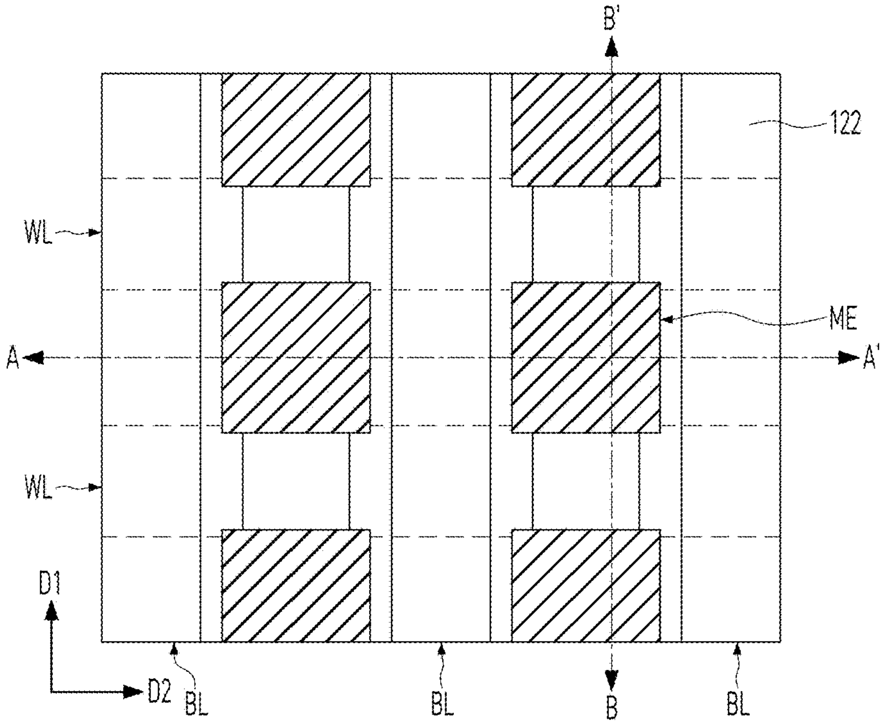
FIG. 1 is a simplified plan view schematic illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
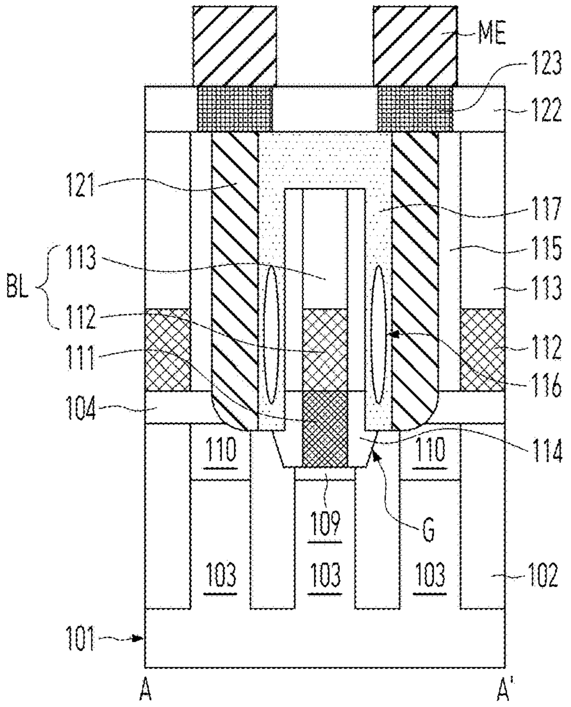
FIGS. 2A and 2B are simplified cross-sectional view schematics illustrating the semiconductor device in accordance with an embodiment of the present invention.
Figure 2B:
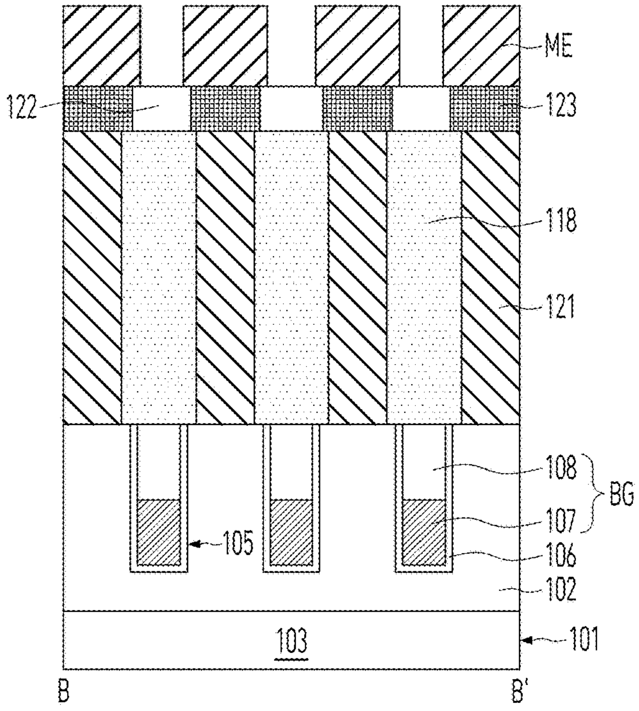

FIG. 1 is a simplified plan view schematic illustrating a semiconductor device in accordance with an embodiment of the present invention. FIGS. 2A and 2B are simplified cross-sectional view schematics illustrating the semiconductor device in accordance with an embodiment of the present invention. FIG. 2A is a cross-sectional view taken along line A-A' shown in FIG. 1. FIG. 2B is a cross-sectional view taken along line B-B' shown in FIG. 1.

Referring to FIGS. 1, 2A, and 2B, a semiconductor device may include a plurality of memory cells. Each memory cell may include conductive structures disposed at different levels. For example, each memory cell may include a cell transistor. The cell transistor may include a buried word line WL, a bit line BL, and a memory element ME.

The isolation layer 102 may be formed in the substrate 101 and define active regions 103. A plurality of active regions 103 may be defined by the isolation layer 102. Each active region 103 may have a bar shape having a major axis and a minor axis. The active regions 103 may be disposed to be spaced apart from each other by a predetermined distance.

The substrate 101 may be formed of a silicon-containing material, including, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include another semiconductor material, such as, for example, germanium. The substrate 101 may include a III/V-group semiconductor substrate, for example, a compound semiconductor substrate, such as, for example, gallium arsenide (GaAs). The substrate 101 may include a silicon-on-insulator (SOI) substrate.

A line-shaped buried word line WL extending in a second direction D2 may be formed over the substrate 101. The buried word line WL may include a buried gate structure BG. The buried gate structure BG may include a gate dielectric layer 106 that is formed conformally on the surface of the gate trench 105, and a gate electrode 107 and a gate capping layer 108 that are formed over the gate dielectric layer 106 to fill the gate trench 105.

For example, a line-shaped gate trench 105 crossing the active region 103 and the isolation layer 102 in the second direction D2 may be formed over the substrate 101. The gate trench 105 may be formed to a predetermined depth in a region defined by the hard mask layer 104 formed on the surface of the substrate 101. The bottom surface of the gate trench 105 may be disposed at a higher level than the bottom surface of the isolation layer 102. In other words, the gate trench 105 may have a shallower depth than the isolation layer 102.

According to another embodiment of the present invention, the bottom portion of the gate trench 105 may have a curvature. According to another embodiment of the present invention, the isolation layer 102 in the direction that the gate trench 105 extends may be etched to a predetermined depth to form a fin in the active region 103.

The gate dielectric layer 106 may be formed conformally on the surface of the gate trench 105. The gate electrode 107 partially filling the gate trench 105 may be formed over the gate dielectric layer 106. A gate capping layer (sealing layer) 108 filling the remaining portion of the gate trench 105 may be formed over the gate electrode 107. The top surface of the gate capping layer 108 may be disposed at the same level as the top surface of the hard mask layer 104. The top surface of the gate electrode 107 may be disposed at a lower level than the top surface of the substrate 101. The gate electrode 107 may be a low-resistance metal material. The gate electrode 107 may include, for example, titanium nitride and tungsten sequentially stacked therein. According to an embodiment of the present invention, the gate electrode 107 may be formed of titanium nitride only (TiN Only).

First and second impurity regions 109 and 110 may be formed over the substrate 101. The first and second impurity regions 109 and 110 may be referred to as ‘first and second source/drain regions’. The first and second impurity regions 109 and 110 may be disposed to be spaced apart from each other by the gate trench 105. Thus, the gate electrode 107 and the first and second impurity regions 109 and 110 may become a cell transistor. The cell transistor may improve a short channel effect by the gate electrode 107 having a buried gate structure.

A first contact 111 may be formed over the substrate 101. The first contact 111 may be coupled to the first impurity region 109. The first contact 111 may be disposed in a contact hole having a bottom surface which is lower than the surface of the substrate 101. In other words, the bottom surface of the first contact 111 may be lower than the top surface of the substrate 101. The bottom surface of the first contact 111 may be lower than the top surface of the active region 103 including the first and second impurity regions 109 and 110. A portion of the first contact 111 may have a line width which is smaller than the diameter of the contact hole. Accordingly, gaps G may be formed on both sides of the first contact 111. The gaps G may be formed independently on both sides of the first contact 111. In other words, a pair of hemispherical gaps G facing each other may be disposed on both sides of the first contact 111, and the pair of gaps G may be separated by the first contact 111. The first contact 111 may include a conductive material. For example, the first contact 111 may be formed of polysilicon or a metal material. The first contact 111 may be referred to as a ‘bit line contact 111’.

A conductive structure BL may be formed over the first contact 111. The conductive structure BL may be referred to as a ‘bit line structure BL’. The conductive structure BL may include a stacked structure of the bit line 112 and the bit line hard mask 113. The bit line 112 may be coupled to the substrate 101 through the first contact 111.

The bit line 112 and the bit line hard mask 113 may be of a line type extending in a first direction D1. The conductive structures BL may be disposed to be spaced apart from each other in the second direction D2. A portion of the bit line 112 may be coupled to the first contact 111. The line width of the bit line 112 and the line width of the first contact 111 may be the same. Accordingly, the bit line 112 may extend in one direction while covering the top surface of the first contact 111. The bit line 112 may include a metal material. The bit line hard mask 113 may include a dielectric material.

According to the embodiment of the present invention, the top surface of the conductive structure BL that overlaps with the first contact 111 may be disposed at a lower level than the top surface of the conductive structure BL that does not overlap with the first contact 111. The height of the bit line hard mask 113 that overlaps with the first contact 111 may be lower than the height of the bit line hard mask 113 that does not overlap with the first contact 111.

A spacer structure may be formed on the sidewalls of the first contact 111 and the conductive structure BL. According to this embodiment of the present invention, the spacer structure of the conductive structure BL that overlaps with the first contact 111 and the spacer structure of the conductive structure BL that does not overlap with the first contact 111 may be different.

The spacer structure of the conductive structure BL overlapping with the first contact 111 may be as follows.

First, gap-fill spacers 114 may be disposed on both sides of the first contact 111 to fill the gaps G. A first spacer 115 formed on both sidewalls of the conductive structure BL and extending in parallel in a direction that the conductive structure BL extends may be disposed over the gap-fill spacer 114. The top surface of the first spacer 115 may be disposed at the same level as the top surface of the conductive structure BL. In other words, the top surface of the first spacer 115 that is disposed next to the bit line 112 overlapping with the first contact 111 may be disposed at a lower level than the top surface of the first spacer 115 disposed next to the bit line 112 that does not overlap the first contact 111. A second spacer 117 may be disposed over the first spacer 115. The second spacer 117 may be disposed between the first spacer 115 and the second contact 121. Also, the second spacer 117 may cover the top portions of the first spacer 115 and the conductive structure BL. The second spacer 117 may include an air gap spacer 116. The air gap spacer 116 may be disposed to partially overlap with at least the bit line 112 in a parallel direction to the substrate surface, but the concept and scope of the present invention are not limited thereto.

The spacer structure disposed next to the conductive structure BL that does not overlap with the first contact 111 may include a first spacer 115 covering both sides of the conductive structure BL.

The gap-fill spacer 114, the first spacer 115, and the second spacer 117 may include a dielectric material. For example, the dielectric material may include one selected from a group including silicon nitride, silicon oxide, silicon oxynitride, and a low-k material, and combinations thereof.

A second contact 121 may be disposed between the neighboring conductive structures BL. The second contact 121 may have a pillar shape. The second contact 121 may be coupled to the second impurity region 110. The second contact 121 may include a conductive material. For example, the conductive material may include a semiconductor material or a metal material. For example, the semiconductor material may include polysilicon. For example, the metal material may include tungsten (W). According to another embodiment of the present invention, the second contact 121 may include a stacked structure of a semiconductor material and a metal material. According to yet another embodiment of the present invention, the second contact 121 may include a stacked structure of a semiconductor material, an ohmic contact layer, and a metal material. The second contact 121 may be referred to as a 'storage node contact 121'.

The conductive structure BL and the second contact 121 may be disposed to be spaced apart from each other by a spacer structure. The spacer structure disposed between the conductive structure BL that overlaps with the first contact 111 and the second contact 121 may be different from the spacer structure disposed between the conductive structure BL that does not overlap with the first contact 111 and the second contact 121. For example, the spacer structure between the conductive structure BL that overlaps with the first contact 111 and the second contact 121 may include the gap-fill spacer 114, the first and second spacers 115 and 117, and an air gap spacer 116. The spacer structure between the conductive structure BL that does not overlap with the first contact 111 and the second contact 121 may include the first spacer 115.

Referring to the cross-sectional view of FIG. 2A crossing the second direction, a spacer structure including the gap-fill spacer 114, the first and second spacers 115 and 117, and the air gap spacer 116 may be disposed on one side of the second contact 121 to be adjacent to the conductive structure BL that overlaps with the first contact 111, and the first spacer 115 may be disposed on the other side of the second contact 121 to be adjacent to the conductive structure BL that does not overlap with the first contact 111.

Referring to the cross-sectional view of FIG. 2B crossing the first direction, the second contacts 121 may be disposed to be spaced apart from each other by a plug isolation layer 118. The isolation layer 118 may include a dielectric material. The isolation layer 118 may include the same material as the second spacer 117. The isolation layer 118 may be formed together with the second spacer 117 simultaneously. The isolation layer 118 may be a material that is formed to be integrated and continuous with the second spacer 117 through a single process.

A landing pad 123 may be formed over the second contact 121. The neighboring landing pads 123 may be isolated by an inter-layer dielectric layer 122. The landing pad 123 may be a structure for interconnection between the second contact 121 and the memory element ME. The landing pad 123 may include a conductive material.

A memory element ME may be formed over the landing pad 123. The memory element ME may include a capacitor including a storage node. The storage node may include a pillar type, but the concept and scope of the present invention are not limited thereto. A dielectric layer and a plate node may be further formed over the storage node. The storage node may have a cylinder shape other than a pillar shape. The storage node may be coupled to the second contact 121 through the landing pad 123.

According to another embodiment of the present invention, diversely implemented memory elements may be coupled to the upper portion of the second contact 121.

FIGS. 3A, 4A, 5A, 6A, 7A, 8A, 9A and 10A are plan views illustrating a method for fabricating a semiconductor device in accordance with an embodiment of the present invention. FIGS. 3B, 4B, 5B, 6B, 7B, 8B, 9B and 10B are simplified cross-sectional view schematics illustrating a method for fabricating a semiconductor device in accordance with an embodiment of the present invention.

Figure 3A:
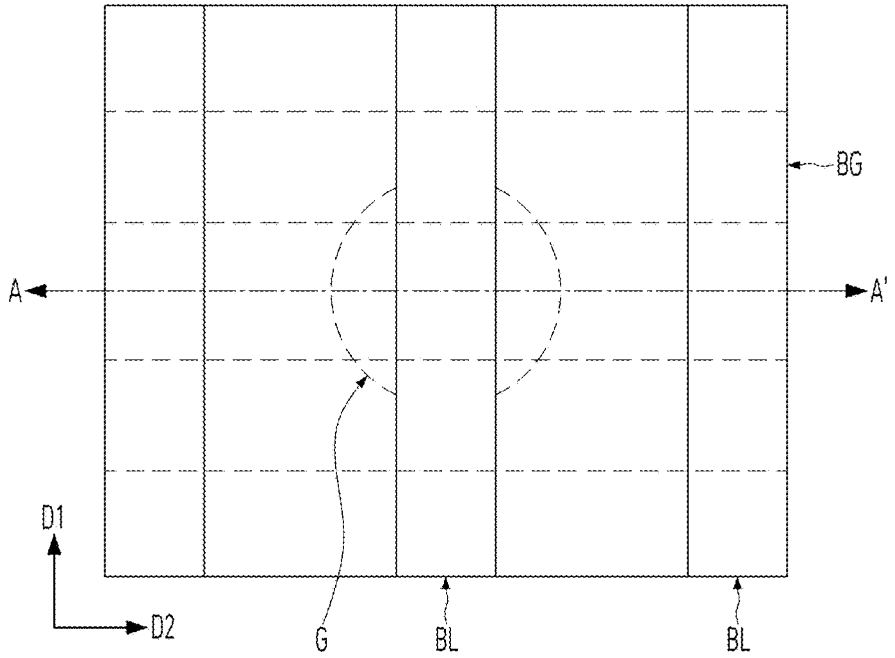
FIGS. 3A, 4A, 5A, 6A, 7A, 8A, 9A and 10A are plan views illustrating a method for fabricating a semiconductor device in accordance with an embodiment of the present invention.
Figure 3B:
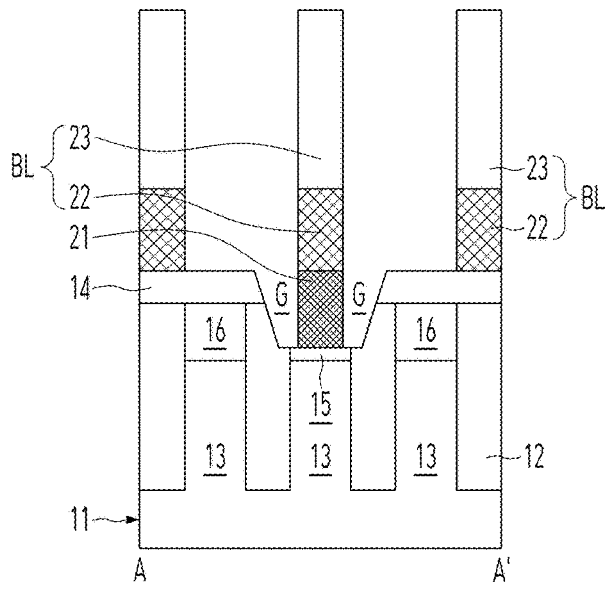
FIGS. 3B, 4B, 5B, 6B, 7B, 8B, 9B and 10B are simplified cross-sectional view schematics illustrating a method for fabricating a semiconductor device in accordance with an embodiment of the present invention.

Referring to FIGS. 3A and 3B, an isolation layer 12 may be formed over a substrate 11 to define active regions 13. Each active region 13 may have an elongated bar shape.

The isolation layer 12 may be formed by a Shallow Trench Isolation (STI) process. The STI process may include etching the substrate 11 to form isolation trenches. The isolation trenches may be filled with a dielectric material, and as a result, the isolation layer 12 may be formed. The isolation layer 12 may include silicon oxide, silicon nitride, or a combination thereof. Chemical Vapor Deposition (CVD) or other deposition processes may be used to fill the isolation trenches with a dielectric material. A planarization process such as Chemical Mechanical Polishing (CMP) may additionally be performed.

Subsequently, a buried gate structure BG may be formed over the substrate 11. The buried gate structure BG may be referred to as a buried word line structure. The buried gate structure BG may be of a line type extending in the second direction D2.

Subsequently, first and second impurity regions 15 16 may be formed. The first and second impurity regions 15 and 16 may be formed by a doping process such as, for example, an implantation process. Hereinafter, the first and second impurity regions 15 and 16 may be referred to as 'first and second source/drain regions 15 and 16'. The first source/drain region 15 and the second source/drain region 16 may have the same depth. According to another embodiment of the present invention, the first source/drain region 15 may be deeper than the second source/drain region 16. The first source/drain region 15 may be a region to which a bit line contact is to be coupled. The second source/drain region 16 may be a region to which a storage contact is to be coupled.

Subsequently, a conductive structure BL coupled to the first source/drain region 15 may be formed. The conductive structure BL may be referred to as a 'bit line structure BL'. The conductive structure BL may include a stacked structure of a bit line 22 and a bit line hard mask 23. The conductive structure BL may be electrically coupled to the first source/drain region 15 through the first contact 21.

A method of forming the conductive structure BL may be performed as follows.

First, the hard mask layer 14 may be etched to form a contact hole. The contact hole may have a circular shape or an oval shape from the perspective of a plan view. A portion of the substrate 11 may be exposed through the contact hole. The contact hole may have a diameter which is controlled to a constant line width. The contact hole may have a form exposing a portion of the active region 13. For example, the first source/drain region 15 may be exposed by the contact hole. The contact hole may have a larger diameter than the width of the minor axis of the active region 13. Therefore, in the etching process for forming the contact hole, portions of the first source/drain region 15 and the isolation layer 12 may be etched. In other words, the first source/drain region 15 and the isolation layer 12 below the contact hole may be recessed to a predetermined depth. As a result, the bottom portion of the contact hole may be expanded into the substrate 11. As the contact hole expands, the first source/drain region 15 may be recessed, and the top surface of the first source/drain region 15 may be disposed at a lower level than the top surface of the second source/drain region 16.

Subsequently, a preliminary plug may be formed to gap-fill the contact hole. The preliminary plug may be formed by a Selective Epitaxial Growth (SEG) process. For example, a preliminary plug may include a SEG SiP. In this way, the preliminary plug may be formed without voids by the selective epitaxial growth process. According to another embodiment of the present invention, the preliminary plug may be formed by a polysilicon deposition process and a CMP process. The preliminary plug may fill the contact hole. The top surface of the preliminary plug may be disposed at the same level as the top surface of the hard mask layer 14.

Subsequently, a conductive layer and a hard mask material layer may be stacked over the hard mask layer 14 including the preliminary plug. A conductive layer and a hard mask material layer may be sequentially stacked over the preliminary plug and the hard mask layer 14. The conductive layer may include a metal-containing material. The conductive layer may include a metal, a metal nitride, a metal silicide, or a combination thereof. According to this embodiment of the present invention, the conductive layer may include tungsten (W). According to another embodiment of the present invention, the conductive layer may include a stack (TiN/W) of titanium nitride and tungsten. Herein, titanium nitride may serve as a barrier. The hard mask material layer may be formed of a dielectric material having an etch selectivity with respect to the conductive layer and the preliminary plug. The hard mask material layer may include silicon oxide or silicon nitride.

Subsequently, a bit line mask layer may be formed over the hard mask material layer. The bit line mask layer may be a mask pattern defining a bit line region. The bit line mask layer may be formed of a material having an etch selectivity with respect to the conductive layer and the hard mask material layer. The bit line mask layer may include a photoresist film pattern. The bit line mask layer may be formed by a patterning method, such as spacer patterning technology (SPT) or double patterning technology (DPT). From the perspective of a plan view, the bit line mask layer may have a line shape extending in the first direction D1.

Subsequently, the hard mask material layer, the conductive layer, and the preliminary plug may be sequentially etched. As a result, the first contact 21 contacting the substrate 11, and a conductive structure BL electrically coupled to the substrate 11 by the first contact 21 and including the bit line 22 and the bit line hard mask 23 that are stacked therein may be formed.

The line width of the conductive structure BL may be smaller than the diameter of the contact hole. Thus, a gap G may be formed around the first contact 21. The gaps G may not have a surrounding shape surrounding the first contact 21, but may be formed independently on both sidewalls of the first contact 21. As a result, one first contact 21 and a pair of gaps G may be disposed in the contact hole, and the pair of gaps G may be separated by the first contact 21. The bottom surface of the gaps G may be disposed at the same level as the recessed top surface of the first source/drain region 15. According to another embodiment of the present invention, the bottom surface of the gaps G may extend into the isolation layer 12. In other words, the bottom surface of the gaps G may be disposed at a lower level than the recessed top surface of the first source/drain region 15.

Figure 4A:
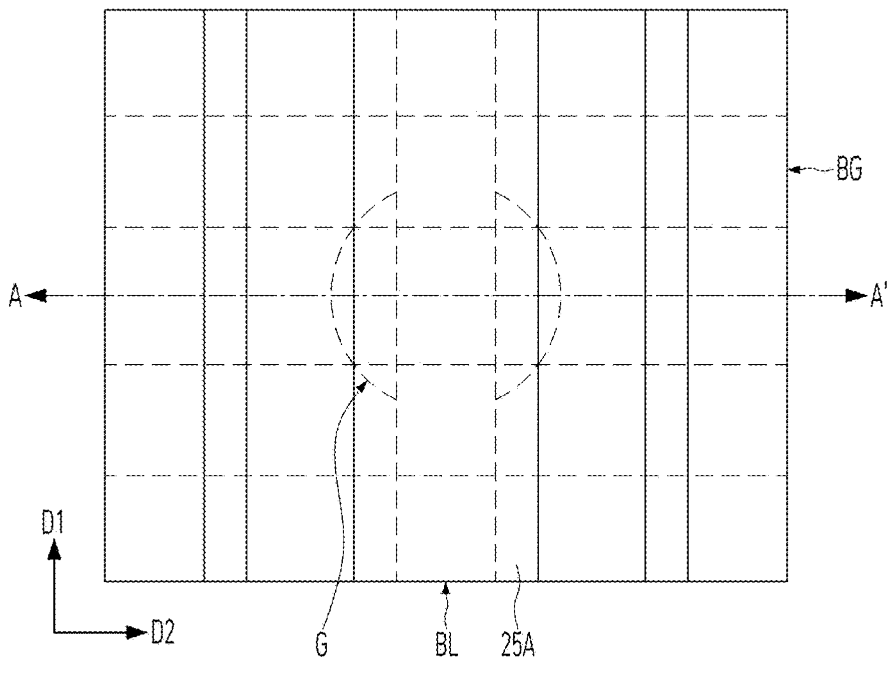
Figure 4B:
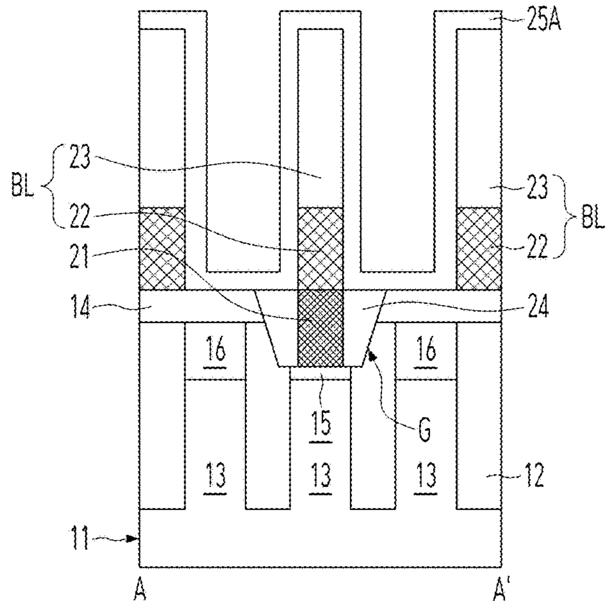

Referring to FIGS. 4A and 4B, gap-fill spacers 24 filling the gaps G may be formed on both sides of the first contact 21.

Subsequently, a first spacer layer 25A may be formed. The first spacer layer 25A may be conformally formed along the entire surface including the sidewalls of the bit line 22 and the bit line hard mask 23.

The gap-fill spacer 24 and the first spacer layer 25A may include a dielectric material. For example, the dielectric material may include one selected from a group including silicon nitride, silicon oxide, silicon oxynitride, low-k materials, and combinations thereof.

Figure 5A:
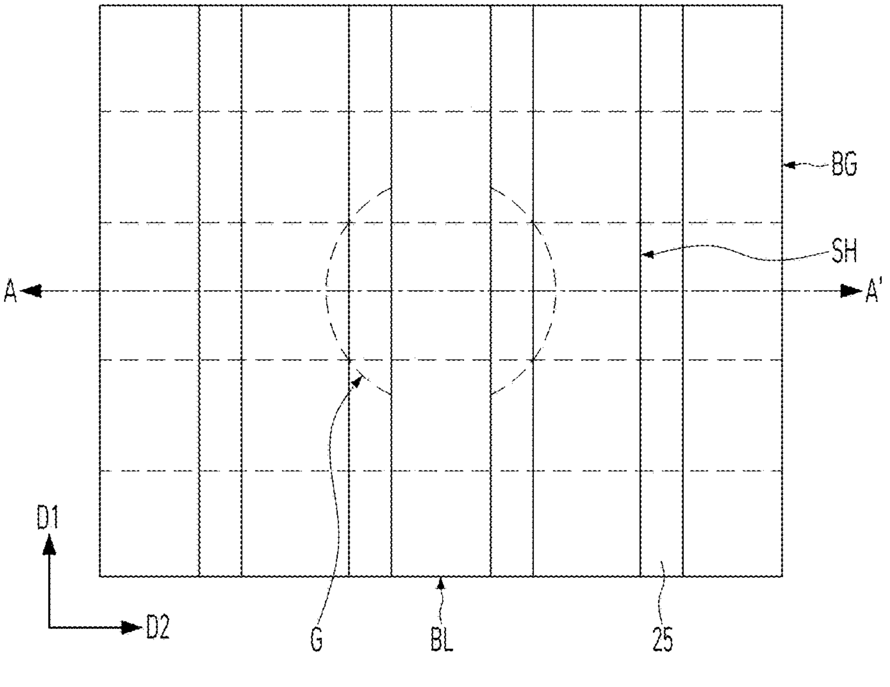
Figure 5B:
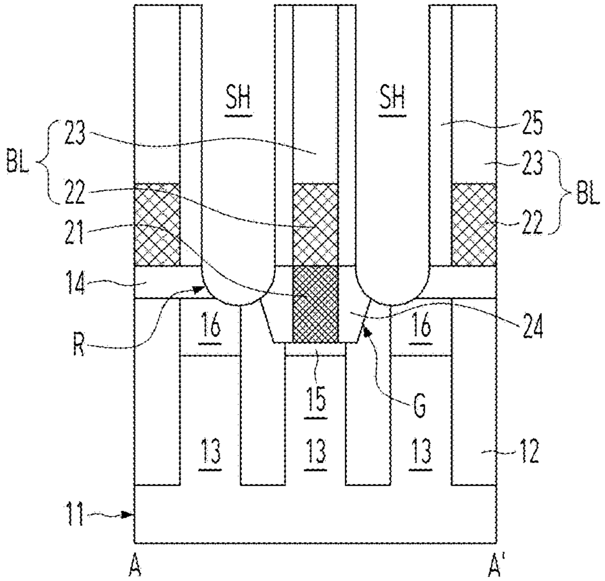

Referring to FIGS. 5A and 5B, a first spacer 25 covering both sidewalls of the conductive structure BL may be formed. Etching the first spacer 25 may be performed by, for example, an etch-back process. The etching process for forming the first spacer 25 may be performed targeting to expose the hard mask layer 14 between the neighboring conductive structures BL. The first spacer 25 may extend in the first direction D1 that the conductive structure BL extends.

Subsequently, a recess R exposing a portion of the active region 13 may be formed by etching the exposed hard mask layer 14. To form the recess R, the hard mask layer 14, the isolation layer 12, and the second source/drain region 16 may be etched to a predetermined depth. The recess R may extend into the substrate 11. The bottom surface of the recess R may be disposed at a lower level than the top surface of the first contact 21. The bottom surface of the recess R may be disposed at a higher level than the bottom surface of the first contact 21.

As the first spacer 25 and the recess Rare formed, a second contact region SH may be exposed. The first spacer 25 may be formed on a sidewall of the line-type conductive structure BL extending in the first direction D1. Accordingly, the region exposed by the first spacer 25 and the recess R may be of a line type that is spaced apart by the conductive structure BL in the second direction D2 and extends in the first direction D1.

Figure 6A:
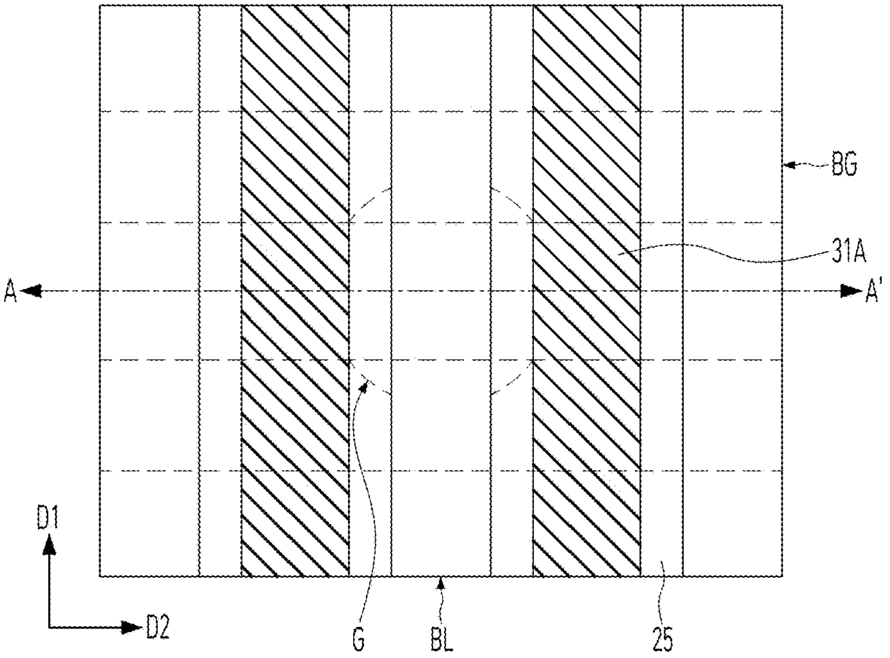
Figure 6B:
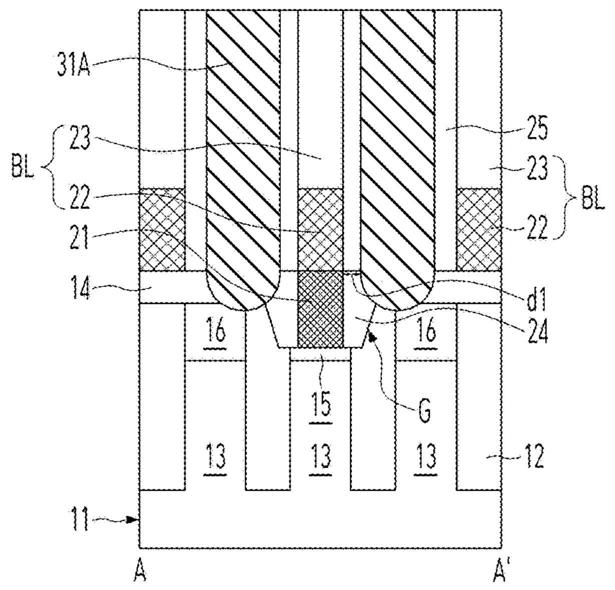

Referring to FIGS. 6A and 6B, a plug material layer 31A may be formed to gap-fill the second contact region SH (see FIG. 5B). The plug material layer 31A may be formed such that all of the line-type second contact regions SH (see FIG. 5B) exposed by the conductive structure BL are gap-filled. As a result, a line-type plug material layer 31A extending in the first direction D1 may be formed. The line-type plug material layers 31A may be spaced apart from each other in the second direction D2. The plug material layer 31A may be spaced apart from the conductive structure BL and the first contact 21 by a distance of d1 in the second direction D2.

The plug material layer 31A may include a conductive material. The plug material layer 31A may include a material having an etch selectivity with respect to the bit line hard mask 23 and the first spacer 25. For example, the plug material layer 31A may include polysilicon, but the concept and scope of the present invention are not limited thereto.

Figure 7A:
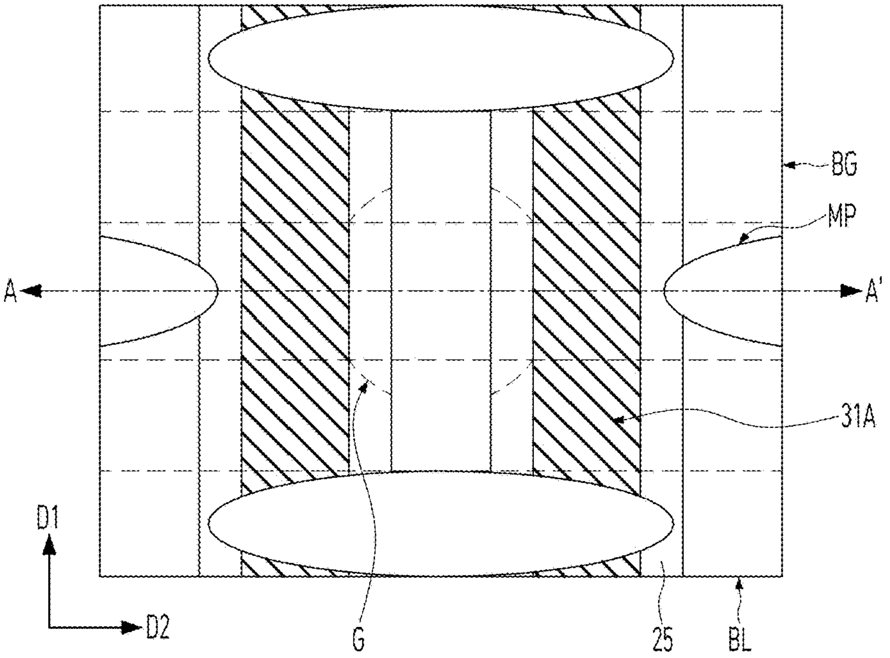
Figure 7B:
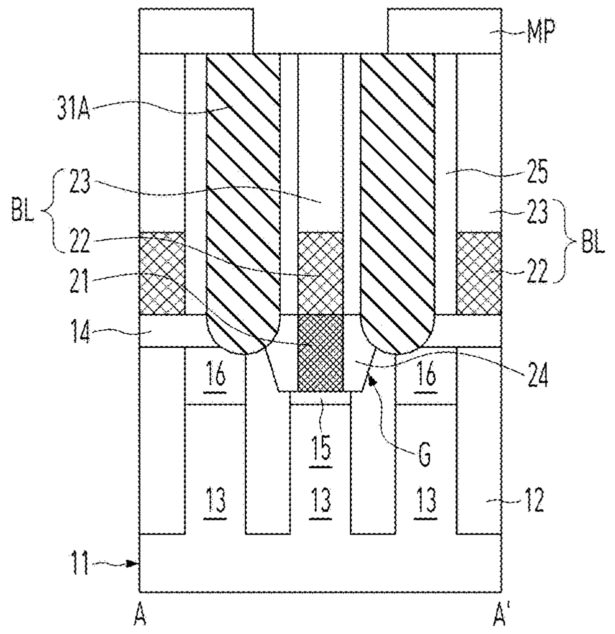

Referring to FIGS. 7A and 7B, a mask pattern MP may be formed. The mask pattern MP may be provided to define the second contact. The mask pattern MP may have an oval shape, but the concept and scope of the present invention are not limited thereto. The mask pattern MP may locally cover the top surface of the plug material layer 31A and the top surface of the conductive structure BL. The mask pattern MP may cover a portion of the plug material layer 31A. The mask pattern MP may cover the top surface of the conductive structure BL that does not overlap with the first contact 21. In other words, the oval-shaped mask pattern MP may cover the plug material layer 31A disposed on both sides of the conductive structure BL that does not overlap with the first contact 21.

In other words, the mask pattern MP may be patterned so that all regions except for the plug material layer 31A to be coupled to a memory element in a subsequent process may be open. Portions of the first spacer 25 and the plug material layer 31A contacting both sidewalls of the conductive structure BL overlapping with the first contact 21 and the conductive structure BL overlapping with the first contact 21 may be exposed by the mask pattern MP.

Figure 8A:
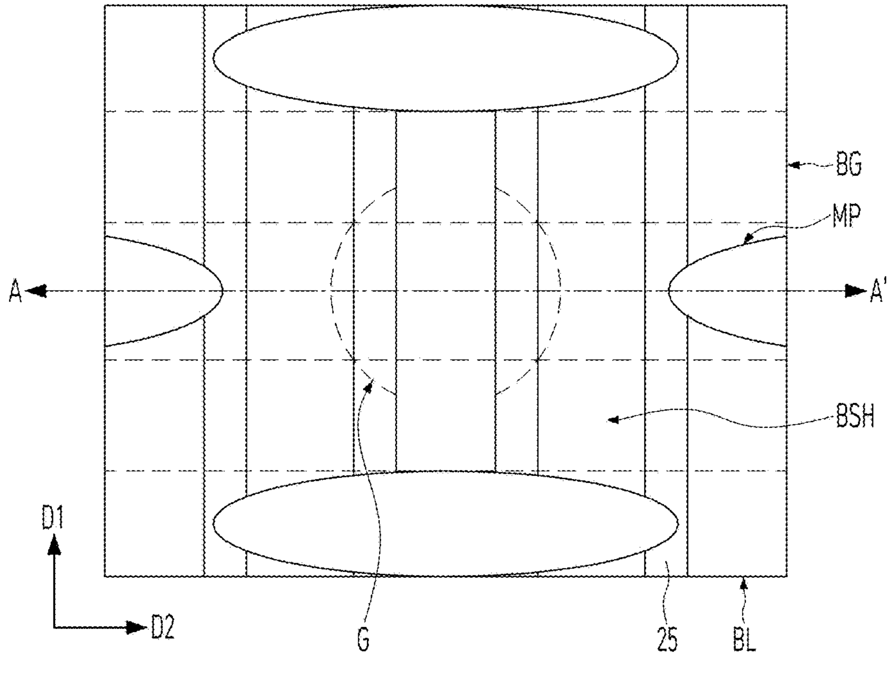
Figure 8B:
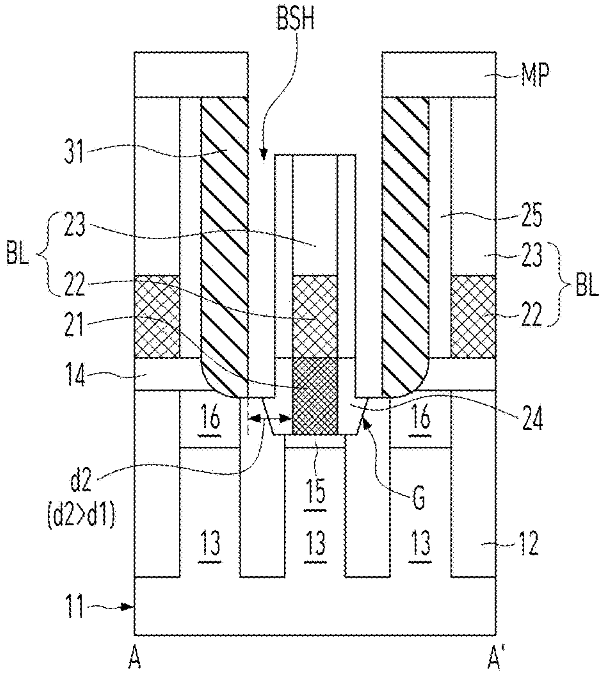

Referring to FIGS. 8A and 8B, a second contact 31 may be formed. The second contact 31 may be formed by etching the plug material layer 31A (see FIG. 7B) exposed by the mask pattern MP. The second contact 31 may be referred to as a 'storage node contact 31'.

The second contacts 31 may be disposed to be spaced apart from each other in the first direction D1. Also, a spacer hole BSH may be formed between the second contact 31 and the first spacer 25 of the conductive structure BL overlapping with the first contact 21. The spacer hole BSH may be formed by a self-align etching process performed by the conductive structure BL. In other words, the spacer hole BSH may be formed between the first spacer 25 and the second contact 31, as the plug material layer 31A exposed by the mask pattern MP is etched and the top surface of the conductive structure BL exposed by the mask pattern MP and overlapping with the first contact 21 is not etched but remains.

For this reason, even though the first contact 21 and the conductive structure BL are mis-aligned in the previous process, since the first contact 21 exposed by the self-align etching process may be etched, a bridge between the first contact 21 and the second contact 31 due to the misalignment may be prevented.

Also, by covering a minimum area with the mask pattern MP and performing the self-alignment etching process, process difficulty may be reduced, and not-open may be prevented by increasing the etching area.

Furthermore, whereas the distance between the plug material layer 31A and the first contact 21 and the conductive structure BL is 'd1' in FIG. 6B, the distance between the second contact 31 and the first contact 21 and the conductive structures BL may be 'd2' which is greater than d1. Therefore, a bridge between the second contact 31 and the first contact 21 may be prevented, and a parasitic capacitance between the second contact 31 and the first contact 21 and the conductive structure BL may be prevented.

When the second contact 31 is formed, a portion of the thickness of the conductive structure BL and the first spacer 25 overlapping with the first contact 21 that is exposed by the mask pattern MP may be etched. Accordingly, the top surface of the conductive structure BL exposed by the mask pattern MP may be disposed at a lower level than the top surface of the conductive structure BL covered by the mask pattern MP. In other words, the top surface of the conductive structure BL that overlaps with the first contact 21 may be disposed at a lower level than the top surface of the conductive structure BL that does not overlap with the first contact 21.

Figure 9A:
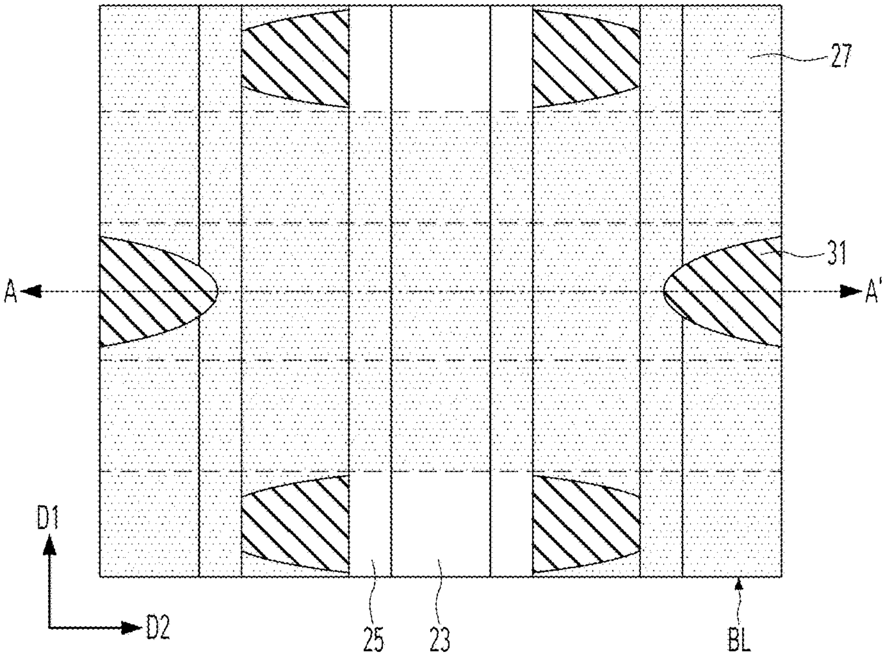
Figure 9B:
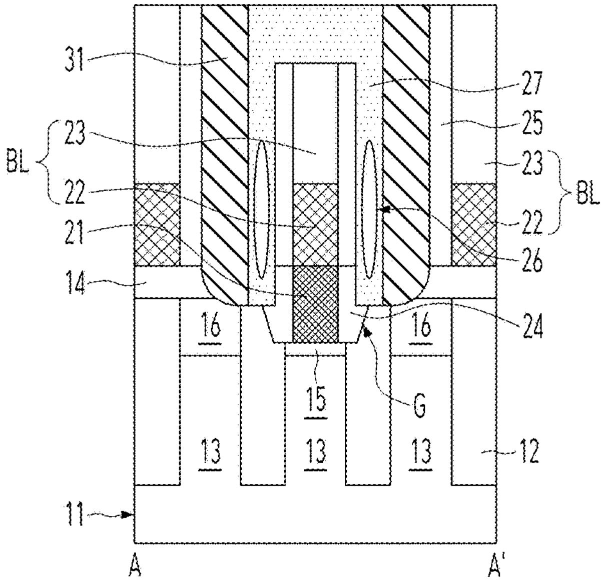

Referring to FIGS. 9A and 9B, a second spacer 27 may be formed to gap-fill the spacer hole BSH (see FIG. 8B). The second spacer 27 may cover the top surface of the conductive structure BL overlapping with the spacer hole BSH (see FIG. 8B) and the first contact 21. The second spacer 27 may be a plug isolation layer that gap-fills the space between the second contacts 31 that are spaced apart in the first direction D1. In other words, the second spacer 27 and the plug isolation layer may be an integrated material that is formed at the same time by a single process. Therefore, the second spacer 27 may be continuous with the plug isolation layer. The second spacer 27 may be formed of the same material as that of the plug isolation layer. The top surface of the second spacer 27 may be disposed at the same level as the top surface of the conductive structure BL that does not overlap with the first contact 21 and the top surface of the second contact 31.

The second spacer 27 may include a dielectric material. For example, the dielectric material may include one selected from a group including silicon nitride, silicon oxide, silicon oxynitride, and low-k materials, and combinations thereof. In particular, according to this embodiment of the present invention, the second spacer 27 may include a material having poor gap-fill characteristics.

The second spacer 27 may provide an air gap spacer 26. The air gap spacer 26 may be formed by a gap-fill margin of a dielectric material when the second spacer 27 is formed. The air gap spacer 26 may partially overlap with the bit line 22 in a parallel direction to the substrate surface, but the concept and scope of the present invention are not limited thereto.

Figure 10A:
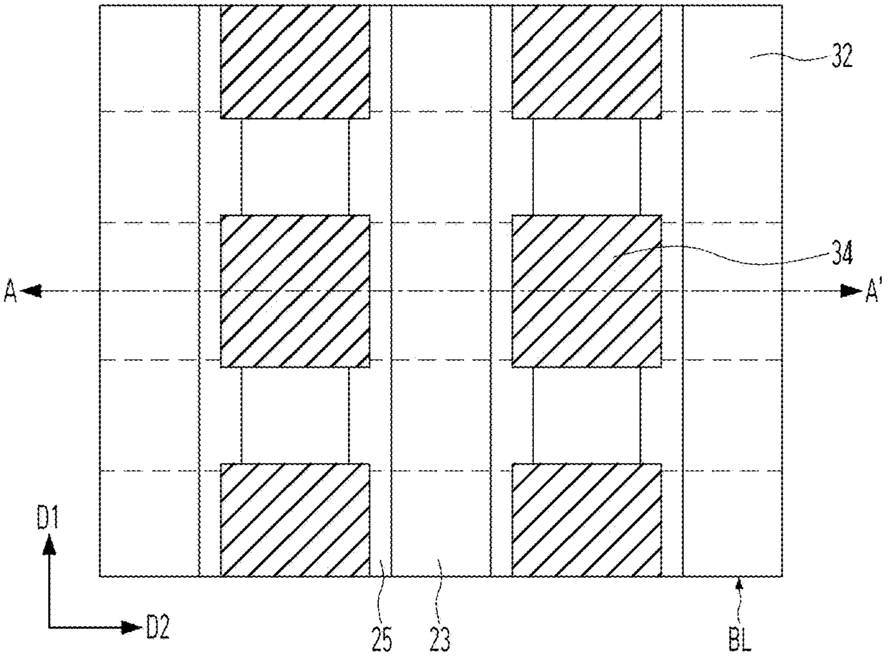
Figure 10B:
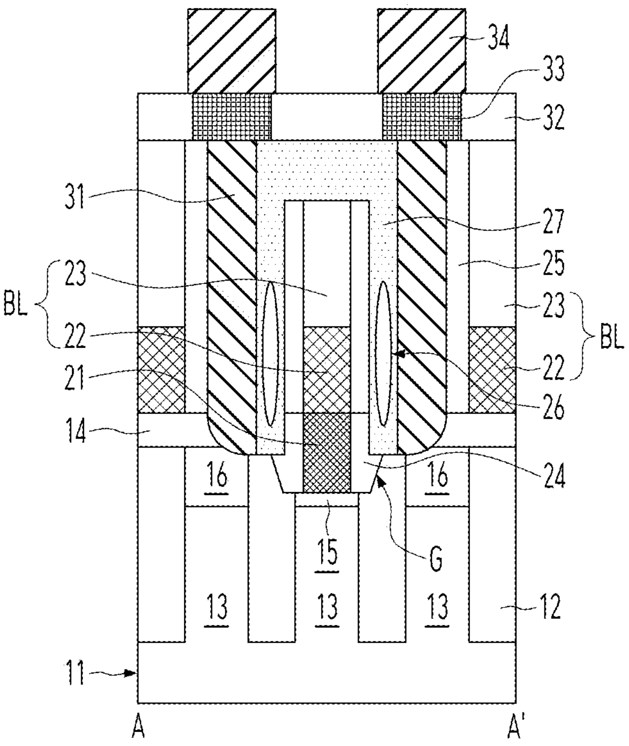

Referring to FIGS. 10A and 10B, a landing pad 33 may be formed over the second contact 31. The landing pads 33 may be disposed to be spaced apart by the inter-layer dielectric layer 32. From the perspective of a plan view, the landing pad 33 may be formed in an island type.

Subsequently, a memory element 34 may be formed over the landing pad 33.

The memory element 34 may include a capacitor including a storage node. The storage node may include a pillar shape, but the concept and scope of the present invention are not limited thereto. A dielectric layer and a plate node may be further formed over the storage node. The storage node may have a cylinder shape other than a pillar shape.

According to the embodiment of the present invention, it is possible to prevent contact-not-open and a bridge between the neighboring conductive structures, which improves reliability of a semiconductor device.

While the present invention has been described with respect to the specific embodiments, it will be apparent to those skilled in the art that various changes and modifications may be made without departing from the scope of the invention as defined in the following claims.

What is claimed is:

1. A semiconductor device, comprising:

a plurality of first contacts spaced apart from each other by a predetermined distance in a semiconductor substrate;

a plurality of conductive structures formed over the first contacts, extending in a first direction and spaced apart in a second direction perpendicular to the first direction, each conductive structure including a first portion vertically overlapping a plurality of the first contacts and a second portion not vertically overlapping the first contacts, the first portion having a top surface at a lower level than a top surface of the second portion;

a plurality of second contacts disposed between neighboring conductive structures; and a plurality of spacer structures disposed between the conductive structures and the second contacts, each spacer structure including a first spacer disposed on sidewalls of the conductive structures and a second spacer formed as a single continuous layer extending from a top surface of the first portion onto both side surfaces of the first spacer.

2. The semiconductor device of claim 1, wherein the spacer structures have different stacked layer configurations on sidewalls of the first portion and on sidewalls of the second portion.

3. The semiconductor device of claim 1, wherein in the spacer structures have a greater thickness on sidewalls of the first portion than on sidewalls of the second portion.

4. The semiconductor device of claim 1, wherein the spacer structures include a stacked structure of a gap-fill spacer, the first spacer, an air gap spacer, and the second spacer on the sidewalls of the first portion.

5. The semiconductor device of claim 4, wherein the air gap spacer partially overlaps with the conductive structure in a parallel direction to the substrate surface.

6. The semiconductor device of claim 1, wherein the second spacer is in direct contact with the top surface of the first portion and the both side surfaces of the first spacer.

7. The semiconductor device of claim 1, wherein a bottom surface of the first contact is disposed at a lower level than a top surface of the substrate.

8. The semiconductor device of claim 1, wherein the second contacts are spaced apart from each other in the first direction, and further includes:

a plug isolation layer gap-filling a space between the second contacts that are spaced apart from each other in the first direction.

9. The semiconductor device of claim 1, wherein the first contact is a bit line contact, and the second contact is a storage node contact.

10. The semiconductor device of claim 1, wherein the conductive structure includes a stacked structure of a bit line and a bit line hard mask.

11. A semiconductor device, comprising:

a plurality of first contacts spaced apart from each other by a predetermined distance in a semiconductor substrate;

a plurality of first conductive structures formed over the first contacts;

a plurality of second conductive structures arranged alternately with the first conductive structure and formed over a hard mask;

a plurality of second contacts disposed between the first conductive structures and the second conductive structures;

a plurality of first spacer structures disposed between the first conductive structures and the second contacts; and a plurality of second spacer structures disposed between the second contacts and the second conductive structures, wherein a top surface of the first conductive structures is at a lower level than a top surface of the second conductive structures, wherein each of the first spacer structure includes a first spacer disposed on sidewalls of the first conductive structures and a second spacer formed as a single continuous layer extending from a top surface of the first conductive structure onto both side surfaces of the first spacer.

12. The semiconductor device of claim 11, wherein the first conductive structures and the second conductive structures are a single continuous conductive line in a first direction.

13. The semiconductor device of claim 11, wherein the first spacer structures and the second spacer structures have different stacked structures.

14. The semiconductor device of claim 11, wherein a thickness of the first spacer structures is greater than a thickness of the second spacer structures.

15. The semiconductor device of claim 11, wherein the first spacer structures include a stacked structure of a gap-fill spacer, a first spacer, an air gap spacer, and a second spacer.

16. The semiconductor device of claim 11, wherein the second spacer structures include a first spacer.

17. The semiconductor device of claim 11, wherein a bottom surface of the first contact is disposed at a lower level than a bottom surface of the hard mask.

18. The semiconductor device of claim 11, wherein the first contact is a bit line contact, and the second contact is a storage node contact.

19. The semiconductor device of claim 11, wherein the first and second conductive structures include a stacked structure of a bit line and a bit line hard mask.

* * * * *